(12) United States Patent
Ma et al.

(10) Patent No.: US 7,358,579 B2
(45) Date of Patent: Apr. 15, 2008

(54) REDUCING THE ACTUATION VOLTAGE OF MICROELECTROMECHANICAL SYSTEM SWITCHES

(75) Inventors: Qing Ma, San Jose, CA (US); Tsung-Kuan Allen Chou, Santa Clara, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 10/185,283

(22) Filed: Jun. 28, 2002

(65) Prior Publication Data

US 2004/0000696 A1  Jan. 1, 2004

Related U.S. Application Data

(63) Continuation-in-part of application No. 09/943,451, filed on Aug. 30, 2001, now Pat. No. 6,531,668.

(51) Int. Cl.
*H01L 21/00* (2006.01)
*H01L 29/82* (2006.01)

(52) U.S. Cl. .............. 257/415; 257/417; 257/420; 257/E25.02; 257/E31.062; 257/E31.093

(58) Field of Classification Search .......... 257/415, 257/417, 420; 438/48, 52
See application file for complete search history.

(56) References Cited

U.S. PATENT DOCUMENTS

| | | | |
|---|---|---|---|
| 5,367,136 A * | 11/1994 | Buck | 200/600 |
| 5,638,946 A * | 6/1997 | Zavracky | 200/181 |
| 5,747,804 A * | 5/1998 | Williams et al. | 250/338.1 |
| 6,040,611 A * | 3/2000 | De Los Santos et al. | 257/415 |
| 6,535,091 B2 * | 3/2003 | Bechtle et al. | 333/262 |
| 6,646,215 B1 * | 11/2003 | Nelson | 200/181 |
| 6,750,775 B2 * | 6/2004 | Chan et al. | 340/669 |
| 6,847,277 B2 * | 1/2005 | Hsu et al. | 335/78 |
| 2002/0027487 A1 * | 3/2002 | Suzuki | 333/262 |
| 2002/0075094 A1 * | 6/2002 | Bechtle et al. | 333/105 |
| 2003/0132824 A1 * | 7/2003 | Ma | 335/78 |

FOREIGN PATENT DOCUMENTS

EP  1344746  * 9/2003

* cited by examiner

*Primary Examiner*—A. Sefer
(74) *Attorney, Agent, or Firm*—Trop, Pruner & Hu, P.C.

(57) ABSTRACT

A microelectromechanical system switch may include a relatively stiff cantilevered beam coupled, on its free end, to a more compliant or flexible extension. A contact may be positioned at the free end of the cantilevered beam. The extension reduces the actuation voltage that is needed and compensates for the relative stiffness of the cantilevered beam in closing the switch. In opening the switch, the stiffness of the cantilevered beam may advantageously enable quicker operation which may be desirable in higher frequency situations.

9 Claims, 5 Drawing Sheets

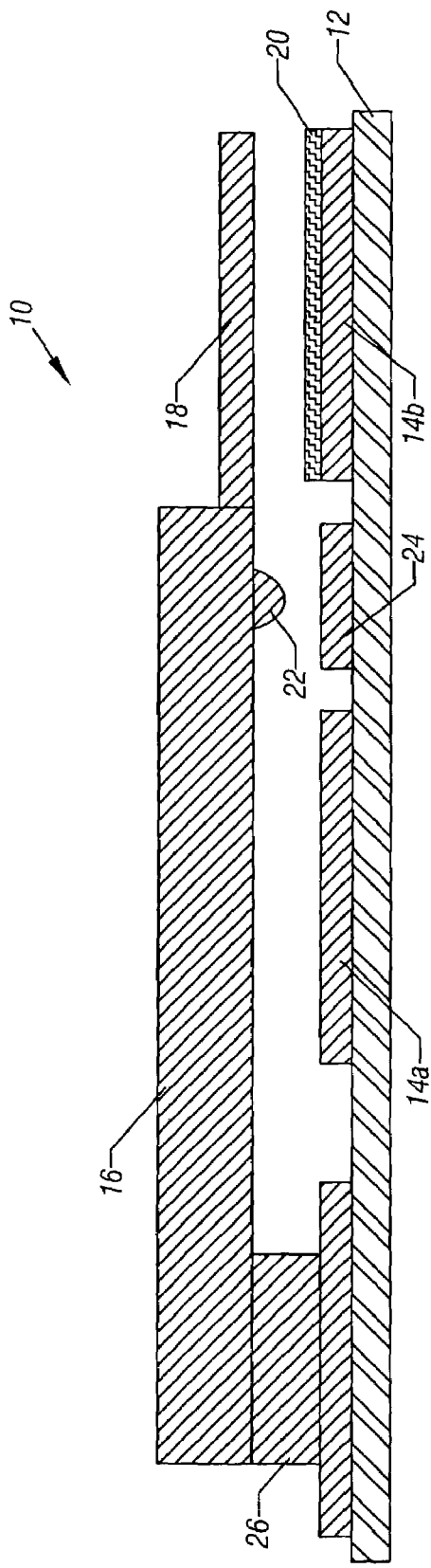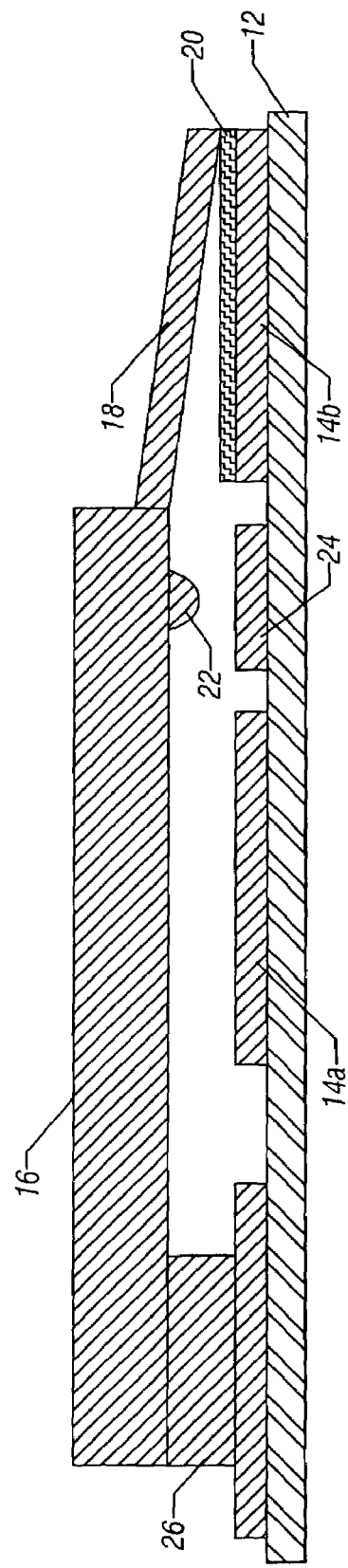

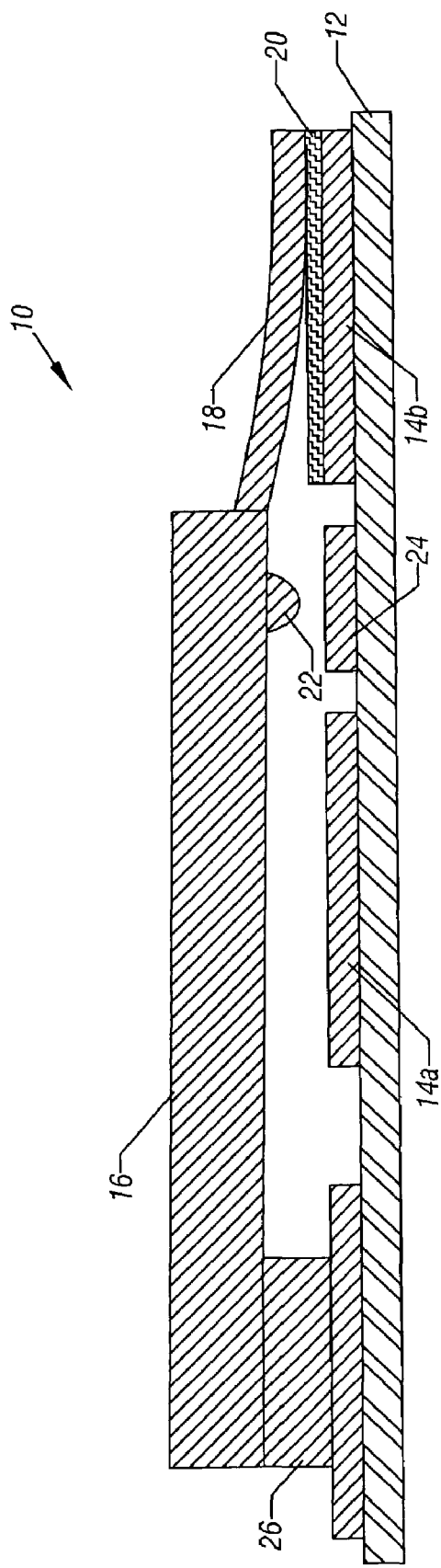
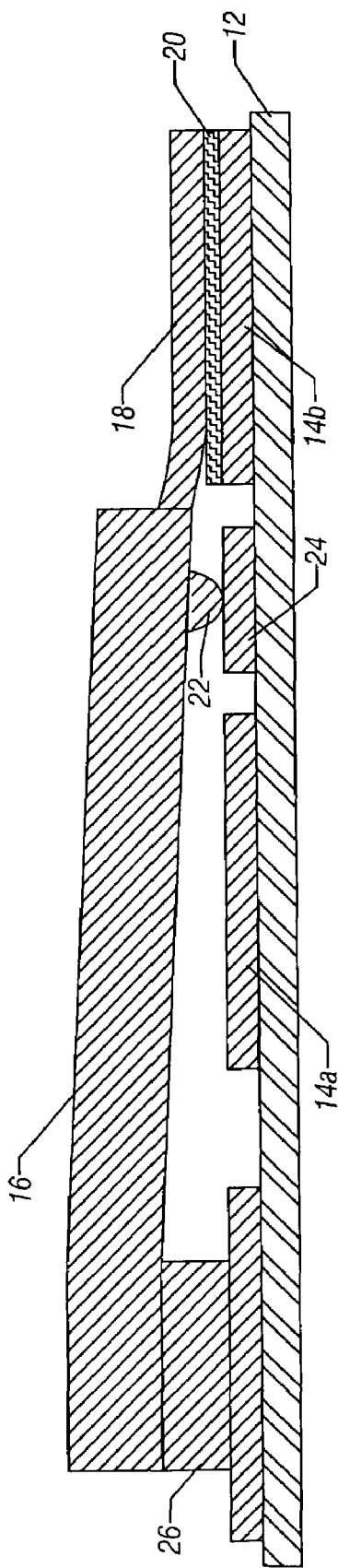
FIG. 2B
FIG. 2C

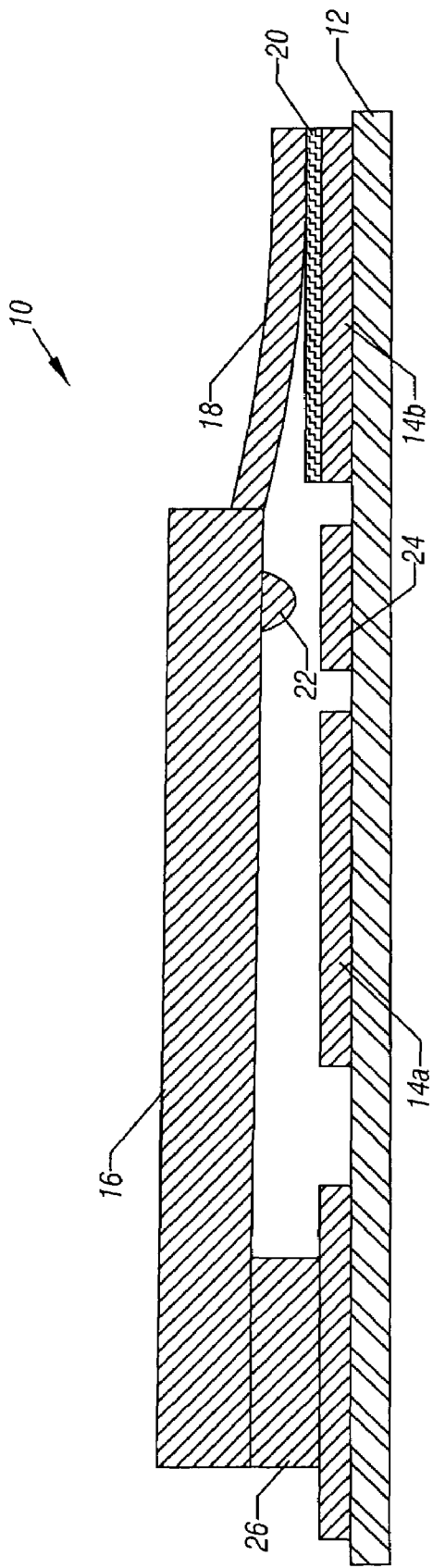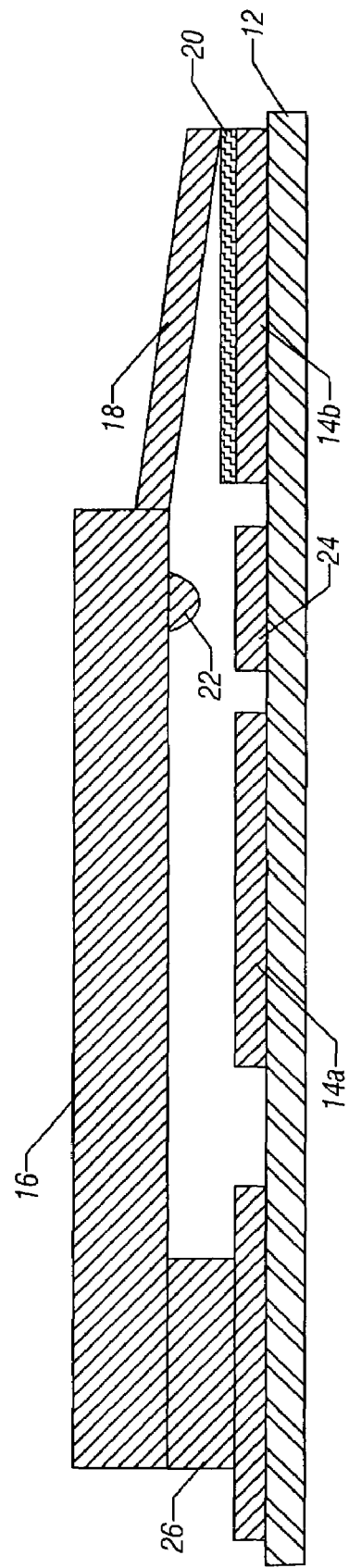
FIG. 3A
FIG. 3B

REDUCING THE ACTUATION VOLTAGE OF MICROELECTROMECHANICAL SYSTEM SWITCHES

This is a continuation-in-part of prior application Ser. No. 09/943,451, filed Aug. 30, 2001, now U.S. Pat. No. 6,531,668.

BACKGROUND

This invention relates generally to microelectromechanical systems (MEMS) and, particularly, to MEMS switches.

Microelectromechanical switches have intrinsic advantages over traditional solid state switches, including low insertion loss, excellent isolation, and superior linearity. However, for higher frequency switching operations, MEMS switches may be too slow or may require too much actuation voltage. This is especially true in radio frequency transmission or receiving switching applications.

Because the speed of a mechanical switch is limited by its resonance frequency, the speed may be increased by increasing the stiffness of the switch. However, a stiff switch requires higher actuation voltage for the switching actuation.

Thus, there is a need for a way to enable MEMS switches to react more quickly without requiring significantly higher actuation voltages.

BRIEF DESCRIPTION OF THE DRAWINGS

FIG. 1 is an enlarged cross-sectional view of one embodiment of the present invention;

FIG. 2A is a cross-sectional view corresponding to FIG. 1 with the switch in a first position;

FIG. 2B is a cross-sectional view corresponding to FIG. 1 with the switch in a second position;

FIG. 2C is a cross-sectional view corresponding to FIG. 1 with the switch in a third position;

FIG. 3A is a cross-sectional view of the switch shown in FIG. 1 in a fourth position;

FIG. 3B is a cross-sectional view of the switch shown in FIG. 1 in a fifth position;

DETAILED DESCRIPTION

Figure 3C:
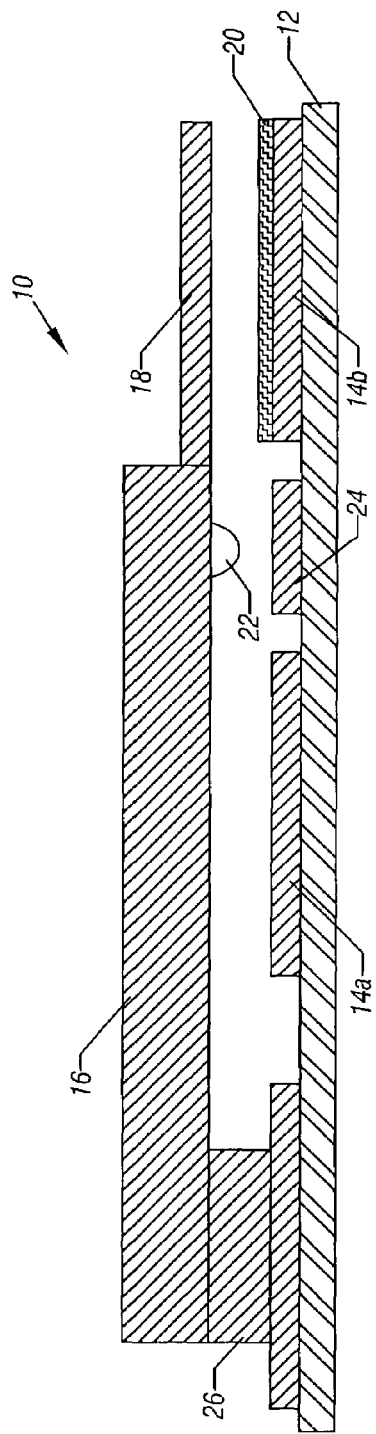
FIG. 3C is a cross-sectional view of the switch shown in FIG. 1 in a sixth position.

Referring to FIG. 1, a microelectromechanical system (MEMS) switch 10 includes a cantilevered beam 16 mounted on a pivot 26, in turn mounted on a substrate 12. The cantilevered beam 16 may be coupled to an extension 18 secured to the free end of the beam 16. An electrical contact 22 is positioned on the underside of the free end of the beam 16.

The cantilevered beam 16 is electrically drawn towards the substrate 12 by the attractive force supplied from an actuator 14a. At the same time, the extension 18 can be drawn towards the substrate 12 by an actuator 14b. When the cantilevered beam 16 approaches the substrate 12 sufficiently, an electrical contact is made between the contact 22 on the beam 16 and a contact pad 24 on the substrate 12.

By application of a voltage to both actuators 14a and 14b, the amount of force that must be applied to the beam 16 may be decreased. As a result, the amplitude of the actuating voltage may be reduced.

At the same time, the beam 16 may be made relatively stiff because its stiffness is not a problem in terms of actuating force. In other words, a stiffer beam 16 may be utilized that reacts more quickly in higher frequency switching applications. At the same time, the beam 16 has lower actuation force, given the stiffness of the beam 16, due to the fact that the extension 18 and the actuator 14b enable lower voltages to be utilized to close the switch 10.

In some embodiments, a relatively thin dielectric layer 20 may be positioned over the actuator 14b. As shown in FIG. 2A, the extension 18 may contact the dielectric layer 20. If the dielectric layer 20 were not present, the protrusion of the contact 22 might interfere with proper operation of the extension 18 in some embodiments.

As shown in FIG. 2A, upon application of a voltage to the actuator pad 14b, the extension 18, which may be more flexible than the beam 16, is deflected toward the actuator 14b and, particularly, its free end is deflected to contact the dielectric layer 20. Thus, the actuation voltage may be determined by the relatively more compliant extension 18. At a voltage that is lower than what would be needed to pull down the stiff cantilevered beam 16, the more compliant extension 18 is bent beyond stability.

Because the dielectric layer 20 is thin and the electrostatic force is proportional to the inverse of the gap, the thinner extension 18 quickly closes, as shown in FIG. 2B. At the same time, the thicker cantilevered beam 16 is pulled down by the thinner extension 18, as shown in FIG. 2C. As a result, lower actuation voltages may be used with higher contact forces.

The release of the closed switch 10 begins, as shown in FIG. 3A, when the actuation voltage is turned off. Since the beam 16 is more stiff than the extension 18, it reacts more quickly than the extension 18 and overcomes any possible stiction. The beam 16 immediately moves off of the contact pad 24 when the actuation force is removed from the pad 14a. The thinner, more compliant, extension 18 is pulled away from the actuator 14b by the stiffer cantilevered beam 16, as shown in FIG. 3B. Eventually the extension 18 pulls away from the dielectric layer 20, as shown in FIG. 3C, resulting in complete separation and complete opening of the switch 10.

Figure 4:
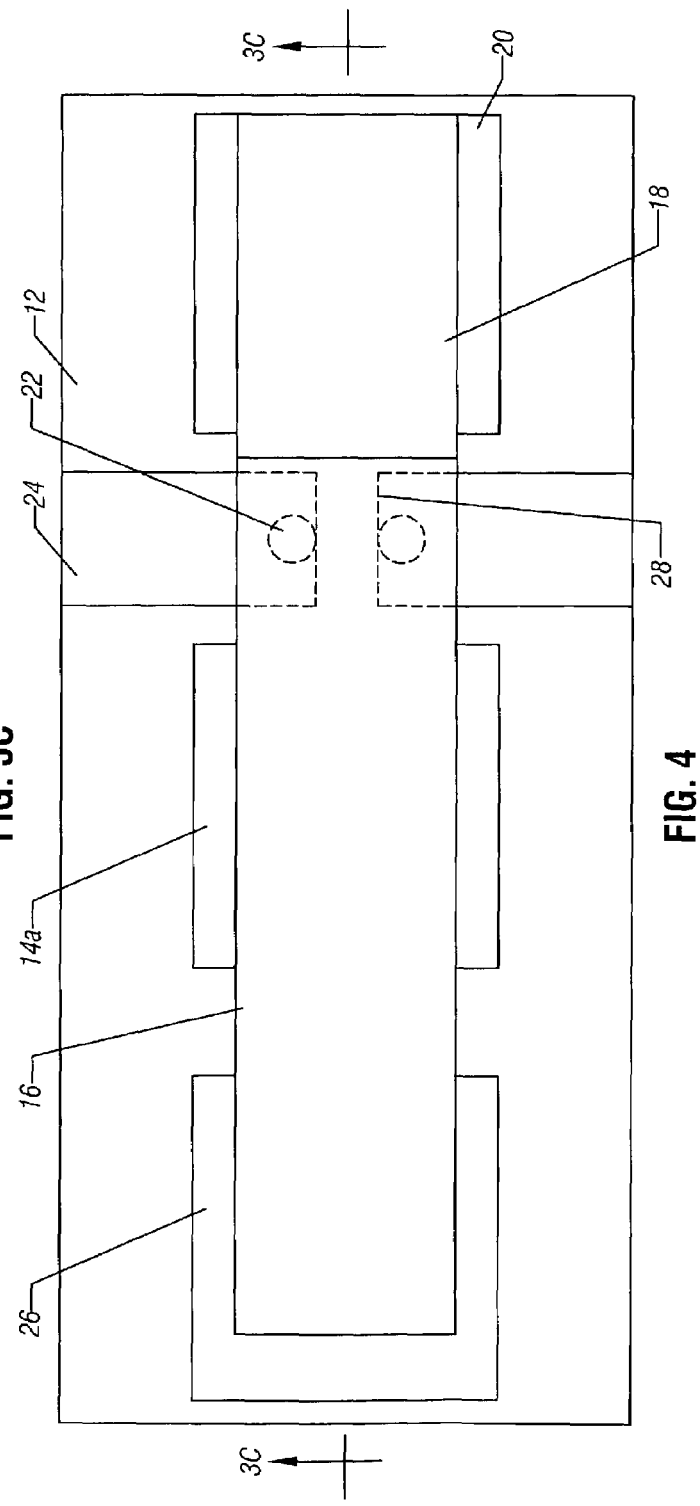
FIG. 4 is an enlarged top plan view of the switch shown in FIG. 3C in one embodiment of the present invention.

Referring to FIG. 4, the switch 10 is a broad side switch in accordance with one embodiment of the present invention. In this case, the electrical contacts are made to a pair of laterally extending signal lines representing by separate, aligned contact pads 24. In such a case, the beam 16 may have a pair of contacts 22 which separately make contact to each pad 24, each of which extend away from the beam 16 in a direction transverse to the length of the beam 16 in one embodiment.

Figure 5:
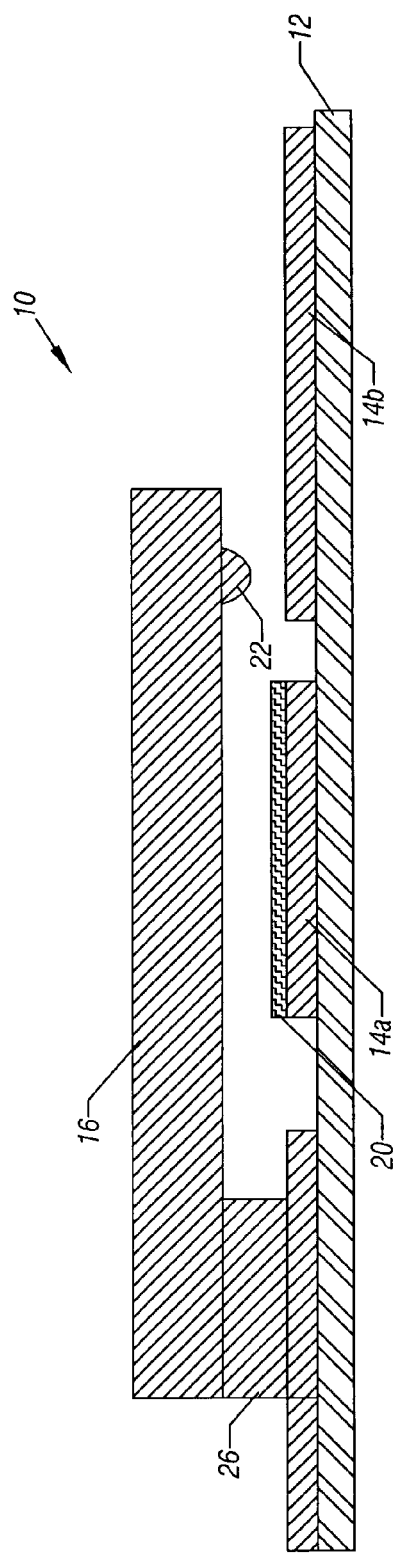
FIG. 5 is an enlarged cross-sectional view of another embodiment of the present invention.

Referring to FIG. 5, the switch 10 may also be implemented as an in-line switch, as another example. The beam 16 itself may be part of the signal line. In this case, extensions 18 may extend laterally outwardly from the free end of the beam 16 in a direction transverse to the length of the beam 16, as shown in FIG. 6.

Figure 6:
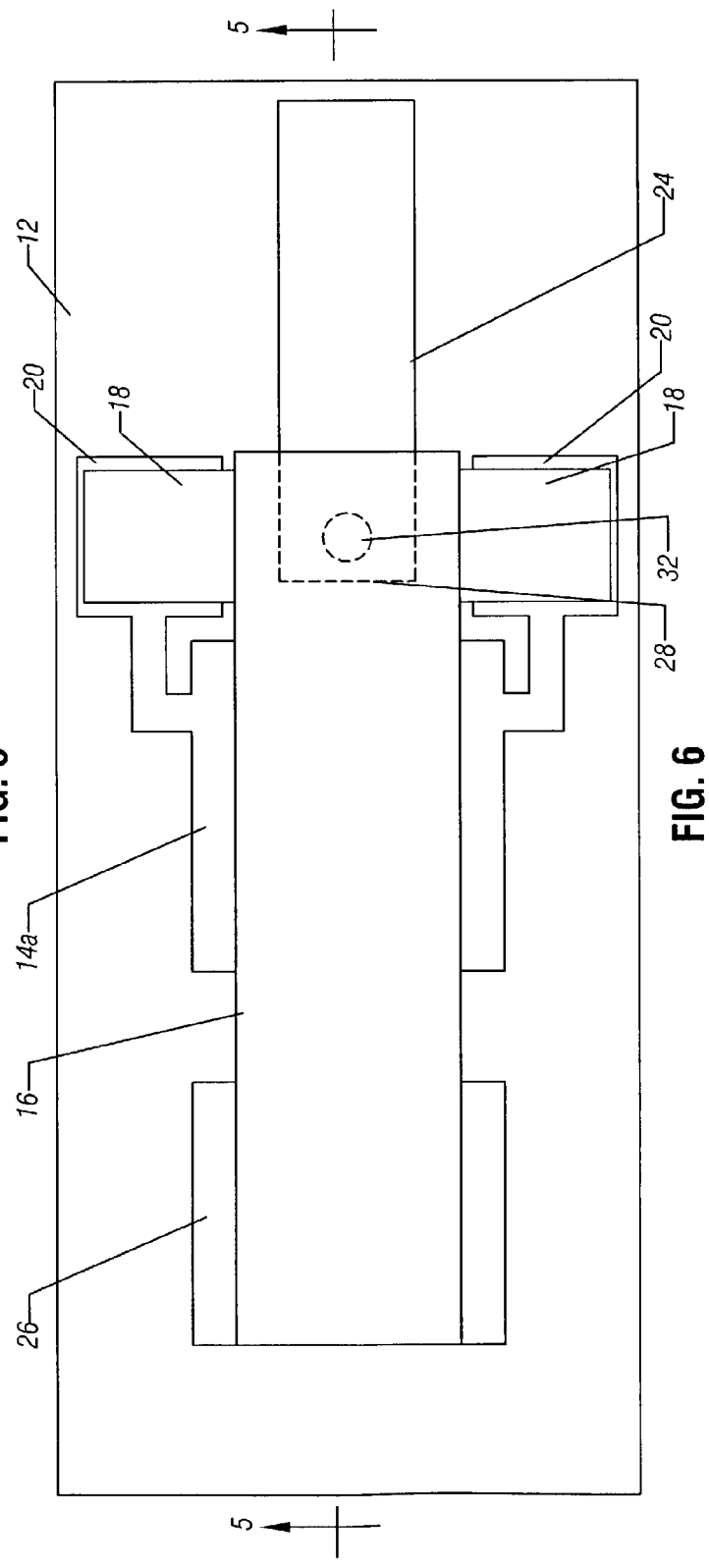
FIG. 6 is a top plan view of the embodiment shown in FIG. 5.

Thus, as shown in FIG. 6, the wing-like extensions 18 extend transversely away from the cantilevered beam 16. The dielectric layer 20 may be positioned beneath each extension 18. The actuator 14b may be located underneath the layer 20. At the same time, the signal line or contact pad 24 may extend in-line, along the length of the cantilevered beam 16 in one embodiment of the present invention. A contact 22 on the underside of the cantilevered beam 16 may make electrical contact with the pad 24.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A microelectromechanical system comprising:
  a substrate;
  a cantilevered beam formed over said substrate;
  an extension formed on said cantilevered beam, said extension being more flexible than said cantilevered beam; and
  a first actuator aligned with said cantilevered beam and a second actuator aligned with said extension, said first and second actuators to move said cantilevered beam towards or away from said substrate, said beam further including a contact which contacts a contact pad on said substrate, said extension contacting said substrate before said cantilevered beam.

2. The system of claim 1 wherein said cantilevered beam includes a free end and said extension extends from said free end of said cantilevered beam.

3. The system of claim 2 including an electrical contact on the free end of said cantilevered beam.

4. The system of claim 3 wherein said contact contacts a contact pad on said substrate, said substrate pad being generally aligned with the length of said cantilevered beam.

5. The system of claim 1 including a pair of pads and a pair of contacts on said cantilevered beam, said pads being contacted by said contacts on said cantilevered beam, each of said pads extending away from said beam in a direction transverse to the length of said cantilevered beam.

6. The system of claim 1 including an actuator for said cantilevered beam and an actuator for said extension.

7. The system of claim 6 wherein said actuators are separate.

8. The system of claim 1 wherein said cantilevered beam moves away from said substrate before said extension.

9. The system of claim 1 including an actuator for said extension, said actuator formed in said substrate, said actuator being covered by a dielectric material.

\* \* \* \* \*